(12) United States Patent
Shimizu et al.

(10) Patent No.: US 11,365,480 B2
(45) Date of Patent: *Jun. 21, 2022

(54) CONCENTRATION CONTROL APPARATUS, ZERO POINT ADJUSTMENT METHOD, AND PROGRAM RECORDING MEDIUM RECORDED WITH CONCENTRATION CONTROL APPARATUS PROGRAM

(71) Applicant: HORIBA STEC, Co., Ltd., Kyoto (JP)

(72) Inventors: Toru Shimizu, Kyoto (JP); Masakazu Minami, Kyoto (JP)

(73) Assignee: HORIBA STEC, CO., LTD., Kyoto (JP)

( * ) Notice: Subject to any disclaimer, the term of this patent is extended or adjusted under 35 U.S.C. 154(b) by 84 days.

This patent is subject to a terminal disclaimer.

(21) Appl. No.: 16/749,282

(22) Filed: Jan. 22, 2020

(65) Prior Publication Data

US 2020/0240015 A1 Jul. 30, 2020

(30) Foreign Application Priority Data

Jan. 28, 2019 (JP) .............................. JP2019-012447

(51) Int. Cl.
*C23C 16/40* (2006.01)
*C23C 16/455* (2006.01)
(Continued)

(52) U.S. Cl.
CPC .... *C23C 16/45544* (2013.01); *C23C 16/4481* (2013.01); *H01L 21/67017* (2013.01)

(58) Field of Classification Search
CPC .......... C23C 16/4402; C23C 16/45544; C23C 16/405; C23C 16/45578; C23C 16/448;
(Continued)

(56) References Cited

U.S. PATENT DOCUMENTS 4,262,686 A 4/1981 Heim et al.
4,393,013 A * 7/1983 McMenamin .......... C30B 25/14
137/101.25
(Continued)

FOREIGN PATENT DOCUMENTS

CN 102156489 8/2011
CN 102541101 7/2012
(Continued)

*Primary Examiner* — Rudy Zervigon
(74) *Attorney, Agent, or Firm* — Greenblum & Bernstein, P.L.C.

(57) ABSTRACT

A concentration control apparatus capable of appropriately making a zero adjustment of a concentration measurement mechanism without interrupting a semiconductor manufacturing process includes: a control valve that controls gas flowing through a lead-out flow path; a concentration measurement mechanism that measures the concentration of source gas contained in gas flowing through the lead-out flow path; a concentration controller that controls the control valve so that the deviation between measured concentration measured by the concentration measurement mechanism and preset set concentration decreases; a judgement time point determination part that determines a judgement time point that is the time point when the gas present in a measurement part where the concentration measurement mechanism performs the concentration measurement has been replaced with other gas; and a zero adjustment part that makes a zero adjustment of the concentration measurement mechanism at or after the judgement time point.

13 Claims, 10 Drawing Sheets

(51) Int. Cl.
*C23C 16/448* (2006.01)
*H01L 21/67* (2006.01)

(58) Field of Classification Search
CPC .............. C23C 16/52; C23C 16/4482; H01L 21/67017; H01L 21/67253; H01L 21/02104; B01D 45/08; B01D 50/002
USPC ...................... 118/729, 723 VE; 156/345.29
See application file for complete search history.

(56) References Cited

U.S. PATENT DOCUMENTS

| | | | | |
|---|---|---|---|---|
| 4,436,674 A * | 3/1984 | McMenamin | .... | C23C 16/45561 137/101.25 |
| 4,640,221 A * | 2/1987 | Barbee | ................ | C23C 16/4485 118/692 |
| 4,717,596 A * | 1/1988 | Barbee | ................ | C23C 16/4485 438/96 |
| 5,174,855 A * | 12/1992 | Tanaka | .............. | H01L 21/67023 216/101 |
| 5,186,120 A * | 2/1993 | Ohnishi | .............. | C23C 16/4481 118/724 |
| 5,190,913 A * | 3/1993 | Higashiyama | ........ | C23C 16/408 118/712 |
| 5,262,356 A | 11/1993 | Fujii | | |
| 5,322,710 A * | 6/1994 | Visser | ................ | C23C 16/4485 118/726 |
| 5,431,733 A * | 7/1995 | Shibuya | .............. | C23C 16/4482 118/715 |
| 5,431,734 A * | 7/1995 | Chapple-Sokol | ..... | C23C 16/403 118/712 |
| 5,520,858 A * | 5/1996 | Yamaguchi | .............. | B01D 1/14 261/153 |
| 5,540,777 A * | 7/1996 | Barbee | .................... | C23C 16/52 118/712 |
| 5,614,247 A * | 3/1997 | Barbee | ................ | C23C 16/52 427/248.1 |
| 5,810,928 A * | 9/1998 | Harada | .................... | C23C 16/52 118/712 |
| 6,007,330 A * | 12/1999 | Gauthier | ................. | C23C 16/52 427/248.1 |
| 6,022,483 A * | 2/2000 | Aral | ..................... | G05D 16/202 156/345.29 |
| 6,089,184 A * | 7/2000 | Kaizuka | ................. | C23C 16/18 118/723 VE |
| 6,136,725 A * | 10/2000 | Loan | ................. | H01L 21/31604 438/758 |
| 6,224,681 B1 * | 5/2001 | Sivaramakrishnan | .. | B01F 23/12 261/DIG. 65 |
| 6,296,711 B1 * | 10/2001 | Loan | ................. | C23C 16/45561 392/399 |
| 6,482,649 B1 * | 11/2002 | Gogol, Jr | ............. | G01N 29/024 436/72 |
| 6,663,716 B2 * | 12/2003 | Loan | ................. | C23C 16/4404 118/726 |
| 6,752,166 B2 * | 6/2004 | Lull | ..................... | G05D 7/0664 137/9 |
| 6,772,781 B2 | 8/2004 | Doty et al. | | |
| 7,438,079 B2 | 10/2008 | Cohen et al. | | |
| 7,485,189 B2 * | 2/2009 | Satake | .................... | C23C 16/52 118/691 |
| 7,827,932 B2 * | 11/2010 | Kojima | .................... | C23C 16/18 118/723 VE |
| 7,883,581 B2 | 2/2011 | Nakaiso et al. | | |
| 7,971,861 B2 * | 7/2011 | Soininen | ............. | C23C 16/4481 261/DIG. 65 |
| 7,975,718 B2 | 7/2011 | Ngo et al. | | |
| 8,026,159 B2 * | 9/2011 | Horii | ................. | C23C 16/45561 118/723 VE |
| 8,047,510 B2 * | 11/2011 | Hirata | .................... | C23C 16/52 261/65 |
| 8,091,575 B2 | 1/2012 | Gammon | | |
| 8,459,290 B2 * | 6/2013 | Minami | ................ | G05D 11/132 261/65 |
| 8,459,291 B2 | 6/2013 | Minami et al. | | |
| 8,931,506 B2 | 1/2015 | Nagata et al. | | |
| 8,931,512 B2 | 1/2015 | Cruse et al. | | |
| 8,997,775 B2 | 4/2015 | Woelk et al. | | |
| 9,605,346 B2 * | 3/2017 | Smith | ................ | C23C 16/45561 |
| 9,970,865 B2 * | 5/2018 | Minami | .............. | G01N 21/3504 |
| 10,138,555 B2 * | 11/2018 | Nishizato | ............ | C23C 16/4481 |
| 10,245,608 B2 | 4/2019 | Dufault et al. | | |
| 10,385,457 B2 | 8/2019 | Yagi et al. | | |
| 10,655,220 B2 * | 5/2020 | Sakaguchi | ........ | C23C 16/45561 |
| 10,927,462 B2 * | 2/2021 | Nishizato | ............ | C23C 16/4481 |
| 10,983,538 B2 * | 4/2021 | Somani | ..................... | G01F 1/88 |
| 2004/0007180 A1 | 1/2004 | Yamasaki et al. | | |
| 2004/0098210 A1 | 5/2004 | Fujiwara et al. | | |
| 2004/0159005 A1 * | 8/2004 | Olander | .................. | C23C 16/52 34/92 |
| 2005/0223979 A1 * | 10/2005 | Shajii | ...................... | C23C 16/52 118/692 |
| 2005/0252450 A1 | 11/2005 | Kowalsky et al. | | |
| 2006/0144338 A1 * | 7/2006 | Liu | ..................... | C23C 16/4481 438/758 |
| 2007/0119816 A1 * | 5/2007 | Urquhart | ............. | H01L 21/6715 216/84 |
| 2008/0141937 A1 | 6/2008 | Clark | | |
| 2011/0311725 A1 * | 12/2011 | Sneh | ...................... | C23C 16/402 423/407 |
| 2014/0020764 A1 | 1/2014 | Woelk et al. | | |
| 2015/0068613 A1 | 3/2015 | Taskar et al. | | |
| 2015/0173647 A1 | 6/2015 | Orr et al. | | |
| 2015/0275367 A1 * | 10/2015 | Moroi | ................ | C23C 16/4481 427/255.28 |
| 2016/0047047 A1 * | 2/2016 | Moroi | ................ | C23C 16/4481 118/712 |
| 2016/0097127 A1 | 4/2016 | Lenz | | |
| 2016/0273101 A1 | 9/2016 | Komori et al. | | |
| 2017/0009346 A1 * | 1/2017 | Kumar | .............. | C23C 16/45542 |
| 2017/0101715 A1 * | 4/2017 | Nishizato | ................ | G01N 21/84 |
| 2018/0258530 A1 * | 9/2018 | Sakaguchi | ........ | C23C 16/45557 |
| 2019/0161863 A1 * | 5/2019 | Nishizato | .......... | H01L 21/67017 |
| 2019/0177850 A1 * | 6/2019 | Shimizu | ............. | C23C 16/4482 |
| 2019/0242818 A1 * | 8/2019 | Nishizato | ........... | G01N 21/3504 |
| 2019/0291144 A1 * | 9/2019 | Siefering | ............. | B08B 3/02 |
| 2020/0115801 A1 * | 4/2020 | Wakabayashi | .... | H01L 21/67017 |
| 2020/0240015 A1 * | 7/2020 | Shimizu | ............. | C23C 16/45525 |
| 2020/0255944 A1 * | 8/2020 | Shimizu | ............. | C23C 16/4481 |
| 2020/0294820 A1 * | 9/2020 | Shimizu | ............. | G05D 11/139 |
| 2020/0340918 A1 * | 10/2020 | Shimizu | ................. | G01N 21/61 |

FOREIGN PATENT DOCUMENTS

| | | |
|---|---|---|
| CN | 104073781 | 10/2014 |
| CN | 104947082 | 9/2015 |
| JP | 60-31043 A | 2/1985 |
| JP | 4-354131 | 12/1992 |
| JP | 5-251375 | 9/1993 |
| JP | 2001-133366 | 5/2001 |
| JP | 2004-091917 | 3/2004 |
| JP | 2004-363271 | 12/2004 |
| JP | 2006-222133 | 8/2006 |
| JP | 2006-324532 | 11/2006 |
| JP | 2008-218760 | 9/2008 |
| JP | 2012-138406 | 7/2012 |
| JP | 2014-196537 | 10/2014 |
| JP | 2014-530673 | 11/2014 |
| TW | 201246294 | 11/2012 |
| WO | 2013/042024 | 3/2013 |

* cited by examiner

CONCENTRATION CONTROL APPARATUS, ZERO POINT ADJUSTMENT METHOD, AND PROGRAM RECORDING MEDIUM RECORDED WITH CONCENTRATION CONTROL APPARATUS PROGRAM

TECHNICAL FIELD

The present invention relates to a concentration control apparatus.

BACKGROUND ART

For example, in a semiconductor manufacturing process, carrier gas is introduced into a tank containing liquid material or solid material, then the material is vaporized to produce source gas, and the source gas is led out of the tank as mixed gas of the carrier gas and the source gas. The concentration of the source gas contained in such mixed gas is kept at a predetermined set concentration by a concentration control apparatus and supplied to a chamber (see Patent Literature 1).

As a conventional concentration control apparatus of a pressure control type, there is one including: a concentration measurement mechanism that is provided in a lead-out flow path for leading mixed gas out of a tank; a control valve that controls the total pressure of the mixed gas in the lead-out flow path; and a concentration controller that controls the control valve on the basis of measured concentration measured by the concentration measurement mechanism and preset set concentration.

In order to keep the accuracy of concentration control in such a concentration control apparatus, it is necessary to regularly make a zero adjustment to prevent an error due to temperature drift or the like from occurring in a measured value by the concentration measurement mechanism.

However, if, for the zero adjustment of the concentration measurement mechanism, a semiconductor manufacturing process is regularly interrupted to make the zero adjustment of the concentration measurement mechanism, there occurs a problem of a reduction in throughput.

CITATION LIST

Patent Literatures

Patent Literature 1: Japanese Unexamined Patent Application Publication No. 60-31043

SUMMARY OF INVENTION

Technical Problem

The present invention has been made in consideration of the problem as described above, and intends to provide a concentration control apparatus capable of appropriately making a zero adjustment of a concentration measurement mechanism without interrupting, for example, a semiconductor manufacturing process.

Solution to Problem

That is, the concentration control apparatus according to the present invention is a concentration control apparatus provided to a vaporizer including: a tank that contains material; a lead-out flow path for leading source gas, which results from vaporization of the material, out of the tank; and a gas supply flow path for introducing other gas different from the source gas to the lead-out flow path, in which the concentration control apparatus includes: a control valve that controls gas flowing through the lead-out flow path; a concentration measurement mechanism that is provided in the lead-out flow path to measure the concentration of the source gas contained in gas flowing through the lead-out flow path; a concentration controller that controls the control valve so that the deviation between measured concentration measured by the concentration measurement mechanism and preset set concentration decreases; a judgement time point determination part that determines a judgement time point that is the time point when the gas present in a measurement part where the concentration measurement mechanism performs the concentration measurement has been replaced with the other gas; and a zero adjustment part that makes a zero adjustment of the concentration measurement mechanism to adjust the value of the concentration measurement of the source gas in gas flowing through the lead-out flow path to be zero on a basis of an internal state in the concentration measurement mechanism at or after the judgement time point.

In such a configuration, for example, when flowing only the other gas from the gas supply flow path to the lead-out flow path, the judgement time point determination part can automatically detect the judgement time point when the gas present in the measurement part where the concentration measurement mechanism performs the concentration measurement has been sufficiently replaced with the other gas. Accordingly, a state where the lead-out flow path does not contain the source gas but is almost filled only with the other gas can be automatically detected without evacuating the lead-out flow path, and the zero adjustment part can appropriately adjust the zero point of the concentration measurement mechanism.

In a process in which a source gas supply period during which the source gas is introduced into a chamber and a purge gas supply period during which only the other gas is introduced are alternately performed, such as an atomic layer deposition (ALD) process, the concentration control apparatus according to the present invention can appropriately makes a zero adjustment of the concentration measurement mechanism without interrupting the process during the purge gas supply period during which only the other gas is flowed. For this reason, it is possible to ensure the accuracy of a measured concentration value and the accuracy of concentration control without reducing throughput.

For example, in order to make it possible to alternately supply the gas containing the source gas and only the other gas into the lead-out flow path and replace the gas present in the measurement part with the other gas to automatically start the zero adjustment, it is only necessary that the vaporizer further includes an introduction flow path for introducing carrier gas that is the other gas into the tank, the gas supply flow path is a bypass flow path that bypasses the tank and connects between the introduction flow path and the lead-out flow path, and the judgement time point determination part is configured to, as the judgement time point, determine the time point when the gas flowing through the lead-out flow path has been replaced with the carrier gas supplied through the bypass flow path.

In order to make it possible to replace the gas flowing through the lead-out flow path using diluent gas as the other gas, and make the zero adjustment, it is only necessary that the gas supply flow path is a diluent gas flow path for introducing the diluent gas that is the other gas into the introduction flow path, and the judgement time point determination part is configured to, as the judgement time point, determine the time point when the gas flowing through the lead-out flow path has been replaced with the diluent gas.

In order to make it possible to, on the basis of a measured value, determine the judgement time point when the gas flowing through the lead-out flow path has been replaced with the other gas, it is only necessary that the concentration control apparatus is configured so that the judgement time point determination part determines the judgement time point on the basis of volume from a supply point from which the other gas is supplied from the gas supply flow path to the lead-out flow path to a measurement point where the concentration measurement mechanism performs the concentration measurement and the flow rate of the other gas supplied from the gas supply flow path.

Even when a mode in which the gas present in the volume is replaced with the other gas is different depending on a location, in order to accurately estimate the time until the replacement with the other gas in the volume is completed and prevent a reduction in the accuracy of the estimation while shortening the time until the start of the zero adjustment, it is only necessary that the volume consists of first volume inside a pipe forming the lead-out flow path and second volume of a cell in which the gas flows from inside the pipe and the concentration is measured by the concentration measurement mechanism, and the judgement time point determination part is configured to determine the judgement time point with use of a first time that is the time when the gas in the first volume has been replaced with the other gas and a second time that is the time when the gas in the second volume has been replaced with the other gas.

In order to make it possible to accurately calculate the time when the gas inside the pipe to the cell has been replaced with the other gas, it is only necessary that the judgement time point determination part calculates as the first time the time until volume indicated by the accumulated flow rate of the other gas becomes equal to the first volume. That is, when the other gas flows into the pipe, the gas inside the pipe is pushed out directly to the cell, and therefore when the volume indicated by the accumulated flow rate matches the first volume, the replacement in the pipe is almost completed.

Specific configuration examples capable of accurately estimating the time point when the replacement with the other gas is sufficiently completed even in a cell where gas replacement cannot be expressed as simple pushing out of gas include one in which the judgement time point determination part is configured to, on the basis of a prediction expression for a residual rate of the source gas ($R_i = R_{i-1}(\text{Exp}(-Q/V*\Delta t))$), calculate as a second time the time when the gas in the cell has been replaced with the other gas, where the residual rate of the source gas at this time point, $R_{i-1}$: the residual rate of the source gas before a unit time $\Delta t$, Q: the flow rate of the other gas and V the second volume of the cell in which the replacement with the other gas to be performed. In addition, as the flow rate of the other gas, a measured value may be used or a set value used for flow rate control may be used.

Specific configuration examples for accurately determining the judgement time point include one in which the concentration measurement mechanism includes: a total pressure sensor that measures the total pressure of the gas present in the measurement part; a partial pressure sensor that measures the partial pressure of the source gas in the gas present in the measurement part; and a concentration calculation part that, on the basis of the total pressure measured by the total pressure sensor and the partial pressure measured by the partial pressure sensor, calculates the concentration of the source gas in the gas flowing through the lead-out flow path, and the judgement time point determination part determines the judgement time point on the basis of the partial pressure measured by the partial pressure sensor.

Other embodiments of the concentration control apparatus according to the present invention include a concentration control apparatus provided to a vaporizer including; a tank that contains material; a lead-out flow path for leading source gas, which results from vaporization of the material, out of the tank; and a gas supply flow path for introducing other gas different from the source gas to the lead-out flow path, in which the concentration control apparatus includes; a control valve that controls gas flowing through the lead-out flow path; a concentration measurement mechanism that is provided in the lead-out flow path to measure the concentration of the source gas contained in gas flowing through the lead-out flow path; a concentration controller that controls the control valve so that the deviation between measured concentration measured by the concentration measurement mechanism and preset set concentration decreases; a judgement time point determination part that determines a judgement time point that is the time point when a predetermined vacuum degree is achieved in a measurement part where the concentration measurement mechanism performs the concentration measurement; and a zero adjustment part that makes a zero adjustment of the concentration measurement mechanism at or after the judgement time point.

In such a concentration control apparatus, it is possible to automatically detect that, for example, the chamber is evacuated at the time of a recipe change, maintenance, or the like, and gas hardly exists in the lead-out flow path, and to also appropriately make the zero adjustment. In this case as well, the zero adjustment can be appropriately made when the predetermined vacuum degree during a predetermined process schedule is kept, and therefore it is possible to prevent a reduction in throughput.

Specific configurations for determining the time point when the predetermined vacuum degree is achieved in the lead-out flow path include one in which the concentration measurement mechanism includes: a total pressure sensor that measures the total pressure of the gas present in the measurement part; a partial pressure sensor that measures the partial pressure of the source gas in the gas present in the measurement part; and a concentration calculation part that, on the basis of the total pressure measured by the total pressure sensor and the partial pressure measured by the partial pressure sensor, calculates the concentration of the source gas in the gas present in the measurement part, and the judgement time point determination part determines the judgement time point on the basis of the total pressure measured by the total pressure sensor or the partial pressure measured by the partial pressure sensor.

In order to make it possible to detect that the predetermined vacuum degree is sufficiently achieved in the lead-out flow path and to determine the judgement time point to make the zero adjustment, it is only necessary that the concentration control apparatus further includes a pressure sensor for low pressure, which is provided on the downstream side of the concentration measurement mechanism in the lead-out flow path, and that the judgement time point determination part determines, as the judgement time point, the time point when pressure measured by the pressure sensor for low pressure becomes a predetermined value or less.

A zero adjustment method according to the present invention is a zero adjustment method for a concentration control apparatus provided to a vaporizer including: a tank that contains material; a lead-out flow path for leading source gas, which results from vaporization of the material, out of the tank; and a gas supply flow path for introducing other gas different from the source gas to the lead-out flow path, in which the concentration control apparatus includes: a control valve that controls gas flowing through the lead-out flow path; a concentration measurement mechanism that is provided in the lead-out flow path to measure the concentration of the source gas contained in gas flowing through the lead-out flow path; and a concentration controller that controls the control valve so that the deviation between measured concentration measured by the concentration measurement mechanism and preset set concentration decreases, and the zero adjustment method includes: a judgement time point determination step of determining a judgement time point that is the time point when the gas present in a measurement part where the concentration measurement mechanism performs the concentration measurement has been replaced with the other gas; and a zero adjustment step of making a zero adjustment of the concentration measurement mechanism at or after the judgement time point.

Such a zero adjustment method makes it possible to automatically determine a state where, for example, during a process, no source gas is present in the concentration measurement mechanism provided in the lead-out flow path and the replacement with the other gas is completed, and to make the zero adjustment of the concentration measurement mechanism without stopping the process.

In order to make it possible to fulfill functions and effects equivalent to those of the concentration control apparatus according to the present invention by upgrading a program used for an existing concentration control apparatus, it is only necessary to use a concentration control apparatus program used for a concentration control apparatus provided to a vaporizer including: a tank that contains material; a lead-out flow path for leading source gas, which results from vaporization of the material, out of the tank; and a gas supply flow path for introducing other gas different from the source gas to the lead-out flow path, in which the concentration control apparatus includes: a control valve that controls gas flowing through the lead-out flow path; and a concentration measurement mechanism that is provided in the lead-out flow path to measure the concentration of the source gas contained in gas flowing through the lead-out flow path. In addition, the concentration control apparatus program instructs a computer to fulfill functions as: a concentration controller that controls the control valve so that the deviation between measured concentration measured by the concentration measurement mechanism and preset set concentration decreases; a judgement time point determination part that determines a judgement time point that is the time point when the gas present in a measurement part where the concentration measurement mechanism performs the concentration measurement has been replaced with the other gas; and a zero adjustment part that makes a zero adjustment of the concentration measurement mechanism at or after the judgement time point. Further, the concentration control apparatus program may be one electronically delivered or recorded on a program recording medium such as a CD, a DVD, and a flash memory.

Advantageous Effects of Invention

As described, the concentration control apparatus according to the present invention makes it possible to automatically determine by itself the time point when the gas present in the measurement part where the concentration measurement mechanism performs the concentration measurement has been replaced with the other gas and the time point when the predetermined vacuum degree is achieved, and to appropriately make the zero adjustment with accuracy. Accordingly, without separately providing an additional sensor to determine the timing to start the zero adjustment or interrupting a process to perform a special operation for the zero adjustment, the zero adjustment of the concentration measurement mechanism can be continuously performed. For this reason, while preventing a reduction in throughput, the accurate zero adjustment can be continuously made to keep high the accuracy of concentration measurement and the accuracy of concentration control.

DESCRIPTION OF EMBODIMENTS

A concentration control system 200 and a concentration control apparatus 100 according to a first embodiment of the present invention will be described with reference to respective drawings.

The concentration control system 200 in the first embodiment is one that supplies a predetermined set concentration of gas into a chamber CN such as a deposition chamber in a semiconductor manufacturing process. In the first embodiment, for example, atoms are deposited layer by layer on the surfaces of multiple wafers contained in the chamber CN by an atomic layer deposition (ALD) process. For this reason, the concentration control system 200 is configured to alternately repeat supply of gas containing a precursor and supply of purge gas not containing a precursor into the chamber CN.

Figure 1:
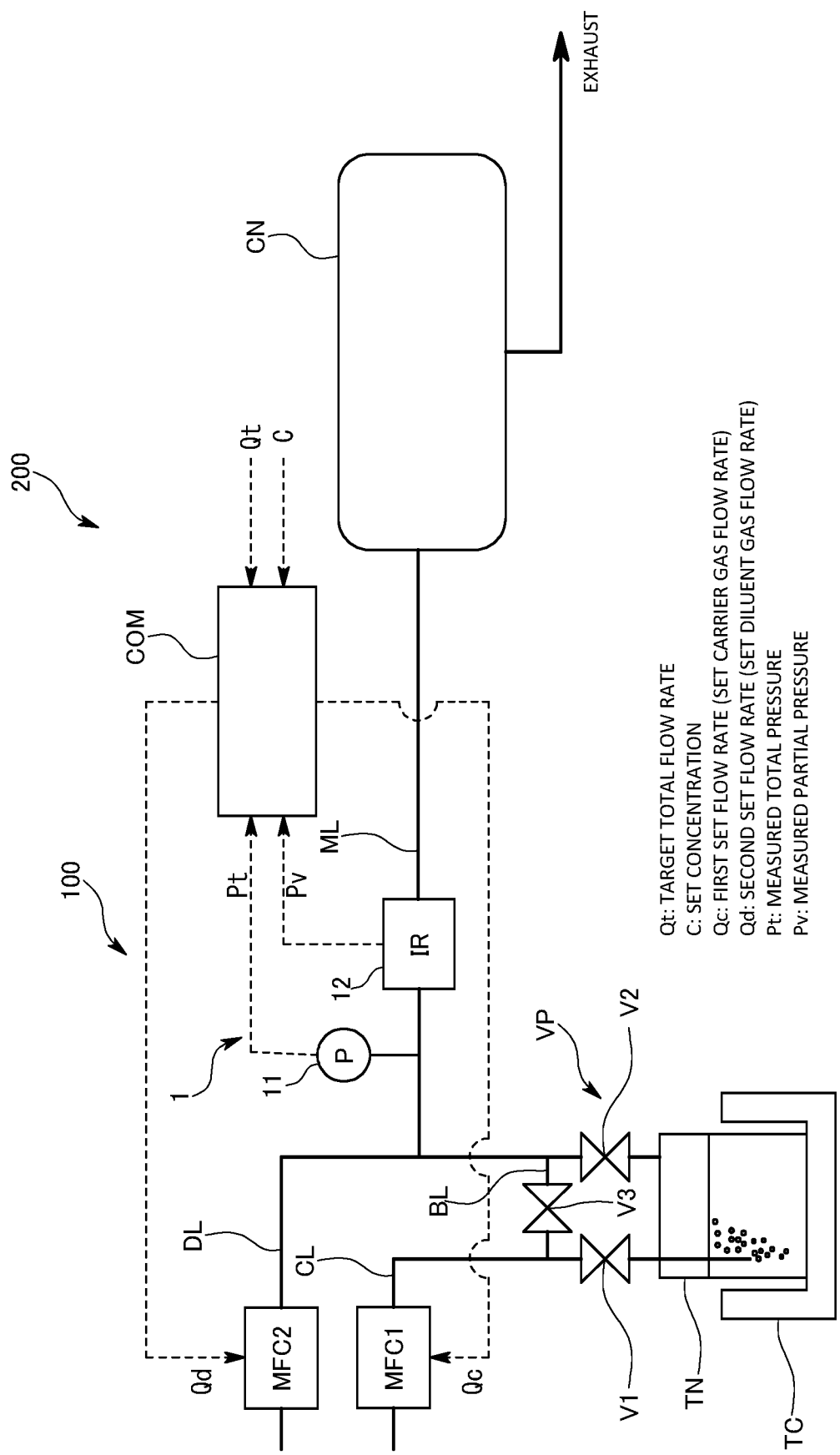
FIG. 1 is a schematic diagram illustrating a concentration control system and a concentration control apparatus according to a first embodiment of the present invention.

As illustrated in FIG. 1, the concentration control system 200 includes, for example, a vaporizer VP that supplies carrier gas to a liquid material to vaporize it, and produces mixed gas of the carrier gas and source gas resulting from the vaporization of the material, and the concentration control apparatus 100 that controls the concentration of the source gas in the mixed gas produced by the vaporizer VP.

The vaporizer VP includes, for example, a tank TN in which the liquid material is contained, an introduction flow path CL for introducing the carrier gas into the tank TN, and a lead-out flow path ML for leading the gas out of the tank TN to the chamber TN. That is, during a period for supplying the precursor into the chamber CN, the material in the tank TN is bubbled by the carrier gas supplied through the introduction flow path CL, and the mixed gas of the carrier gas and the source gas resulting from the vaporization of the material flows through the lead-out flow path ML and is supplied to the chamber CN. Around the tank TN, a temperature control mechanism TC including a constant temperature bath, a heater, a temperature controller, and others is provided. The temperature control mechanism TC keeps the temperature inside the tank TN constant at, for example, a temperature appropriate for vaporizing the material.

Also, the vaporizer VP includes: a diluent gas flow path DL for supplying diluent gas for diluting the mixed gas directly to the lead-out flow path ML; and a bypass flow path BL that bypasses the tank TN from the introduction flow path CL to connect between the introduction flow path CL and the lead-out flow path ML. In addition, the bypass flow path BL is used to directly flow the carrier gas from the introduction flow path CL to the lead-out flow path ML without flowing the source gas into the lead-out flow path ML during a period for purging the inside of the chamber CN.

Note that the gas produced by the vaporization of the material in the tank TN is the source gas and the carrier gas and the diluent gas are other gases. The mixed gas consists of the source gas and the other gases as components. Also, the bypass flow path BL and the diluent gas flow path DL correspond to gas supply flow paths for introducing the other gases to the lead-out flow path ML.

The concentration control apparatus 100 includes: a first mass flow controller MFC1 provided in the introduction flow path CL; a second mass flow controller MFC2 provided in the diluent gas flow path DL; a concentration measurement mechanism 1 provided in the lead-out flow path ML; and a control mechanism COM that, on the basis of a measured value measured by the concentration measurement mechanism 1, sets set flow rates in the first mass flow controller MFC1 and the second mass flow controller MFC2 to perform control. Further, the concentration control apparatus 100 includes: a first on-off valve V1 provided on the downstream side of the connecting point of the bypass flow path B in the introduction flow path CL; a second on-off valve V2 provided on the upstream side of the connecting point of the bypass flow path BL in the lead-out flow path ML; and a third on-off valve V3 provided in the bypass flow path BL. The concentration control apparatus 100 is configured to switch whether the carrier gas passes through the tank TN or bypasses the tank TN by switching the on/off of these on-off valves.

The first mass flow controller MFC1 is one that includes a first flow rate sensor, a first control valve, and a first flow rate controller, and is configured as one module by containing and integrating these devices in a housing. The first mass flow controller MFC1 is inputted with the first set flow rate from the control mechanism COM and performs flow rate control so that the flow rate of the carrier gas to be introduced into the tank TN is kept at the first set flow rate. Specifically, the first flow rate controller performs flow rate feedback control of the opening level of the first control valve so that the deviation between the measured flow rate of the carrier gas measured by the first flow rate sensor and the inputted first set flow rate decreases.

The second mass flow controller MFC2 is one that includes a second flow rate sensor, a second control valve, and a second flow rate controller, and is configured as one module by containing and integrating these devices in a housing. The second mass flow controller MFC2 is inputted with the second set flow rate from the control mechanism COM and performs flow rate control so that the flow rate of the diluent gas to be supplied to the lead-out flow path ML is kept at the second set flow rate. Specifically, the second flow rate controller performs flow rate feedback control of the opening level of the second control valve so that the deviation between the measured flow rate of the diluent gas measured by the second flow rate sensor and the inputted second set flow rate decreases.

The concentration measurement mechanism 1 is one that, on the basis of the total pressure of the mixed gas and the partial pressure of the source gas, measures the concentration of the source gas in the mixed gas present in a measurement part. Specifically, the concentration measurement mechanism 1 includes: a total pressure sensor 11 that measures the total pressure of the mixed gas; a partial pressure sensor 12 that measures the partial pressure of the source gas; and a concentration calculation part 13 that calculates the concentration of the source gas in the mixed gas on the basis of the measured total pressure and partial pressure. More specifically, the partial pressure sensor 12 is provided in a cell formed in the lead-out flow path ML, and the total pressure sensor 11 is provided in a pipe connecting between the cell and the tank. Note that the total pressure sensor 11 may be provided in the cell or provided in a pipe connected on the downstream side of the cell. In addition, the cell has a larger flow path area than the inside diameter of the pipe. The measurement part of the concentration measurement mechanism 1 can be defined as, for example, a part from a point where the total pressure sensor 11 is provided to the outlet of the cell. Also, when the total pressure sensor 11 is provided in the cell, the measurement part can be defined as the cell itself.

In addition, the total pressure sensor 11 is one that measures the total pressure of the mixed gas on the basis of, for example the deformation amount of a diaphragm. On the other hand, the partial pressure sensor 12 includes: a light source that emits light including the absorption wavelength band of the source gas; a light receiver that receives light passing through the mixed gas; and a signal processor that outputs a partial pressure signal corresponding to the output of the light receiver. The light emitted from the light source has a wavelength band, which is absorbed only by the source gas but is not absorbed by the carrier gas or the diluent gas. Accordingly, the light receiver measures only absorptance due to the source gas. The signal processor outputs the partial pressure signal indicating corresponding partial pressure to the concentration calculation part 13 on the basis of the light absorptance and a calibration curve.

The concentration calculation part 13 calculates the concentration of the source gas in the mixed gas by dividing the measured partial pressure by the measured total pressure. In addition, the concentration calculation part 13 is configured using an arithmetic function of the below-described control mechanism COM.

Next, the details of the control mechanism COM will be described. The control mechanism COM in the first embodiment is one that controls the operations of the first mass flow controller MFC1 and the second mass flow controller MFC2, and thereby controls the flow rate of the mixed gas to be finally supplied to the chamber CN through the introduction flow path CL and the concentration of the source gas in the mixed gas. In addition, the control mechanism COM has a function of not only performing the above-described concentration control but also automatically making a zero adjustment of the concentration measurement mechanism 1.

Figure 2:
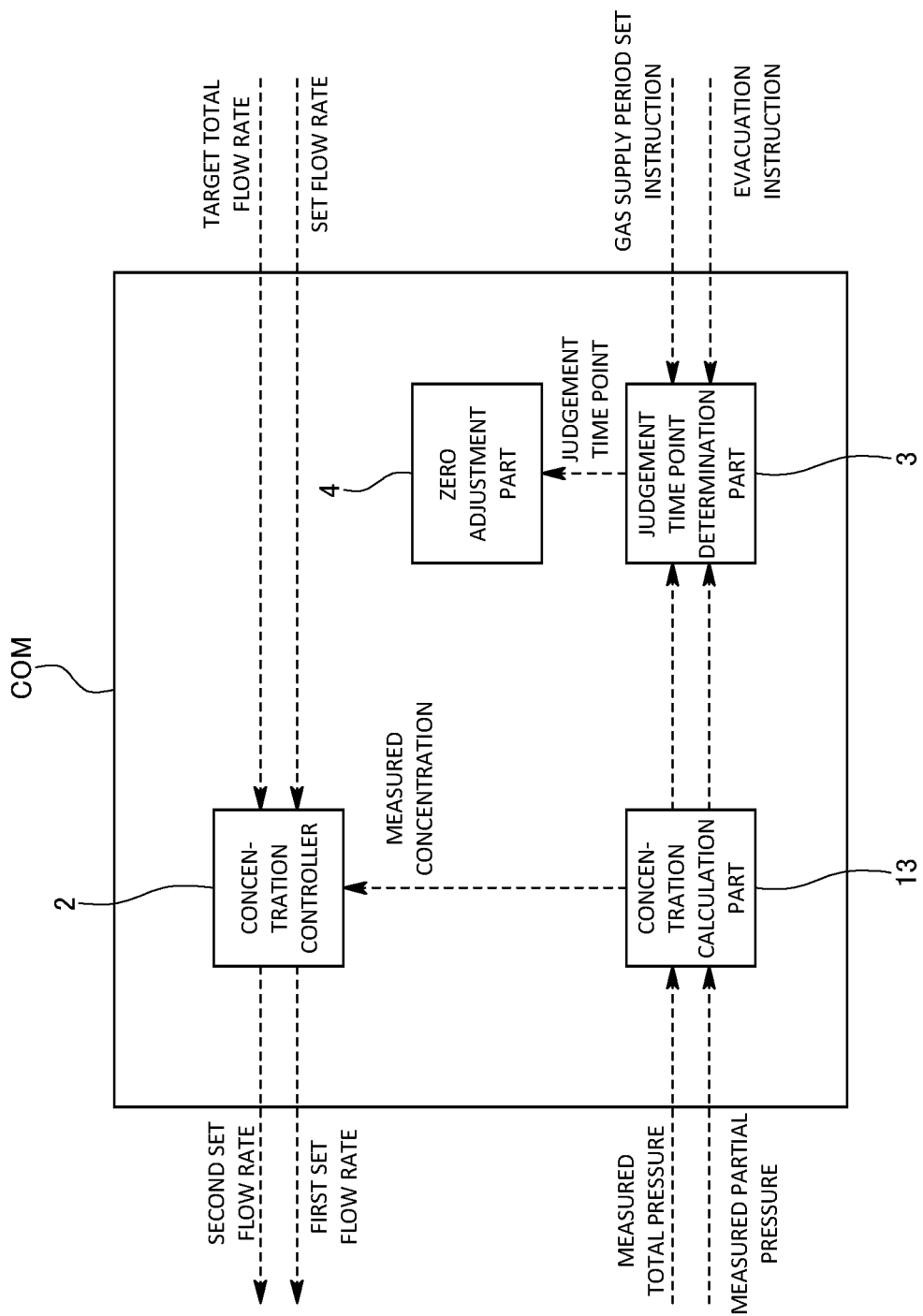
FIG. 2 is a functional block diagram illustrating the details of a control mechanism in the first embodiment.

Specifically, the control mechanism COM is a so-called computer including a CPU, a memory, an A/D converter, a D/A converter, and various input/output means. The control mechanism COM is one that fulfills functions as at least a concentration controller 2, a judgement time point determination part 3, and a zero adjustment part 4 as illustrated in FIG. 2 by executing a concentration control apparatus program stored in the memory to allow various devices to cooperate.

The concentration controller 2 controls the opening levels of the first control valve and the second control valve by inputting the first set flow rate and the second set flow rate respectively in the first mass flow controller MFC1 and the second mass flow controller MFC2. Specifically, the concentration controller 2 is inputted with the set concentration of the source gas contained in the mixed gas, which is preset by a user, and the target total flow rate of gas desired to be flowed through the lead-out flow path ML. The first set flowrate that is the target flowrate of the carrier gas is successively changed by concentration feedback control based on the deviation between the set concentration and the measured concentration. Also, the second set flow rate that is the target flow rate of the diluent gas is set so that a total amount with the first set flow rate matches the target total flow rate.

Figure 3:
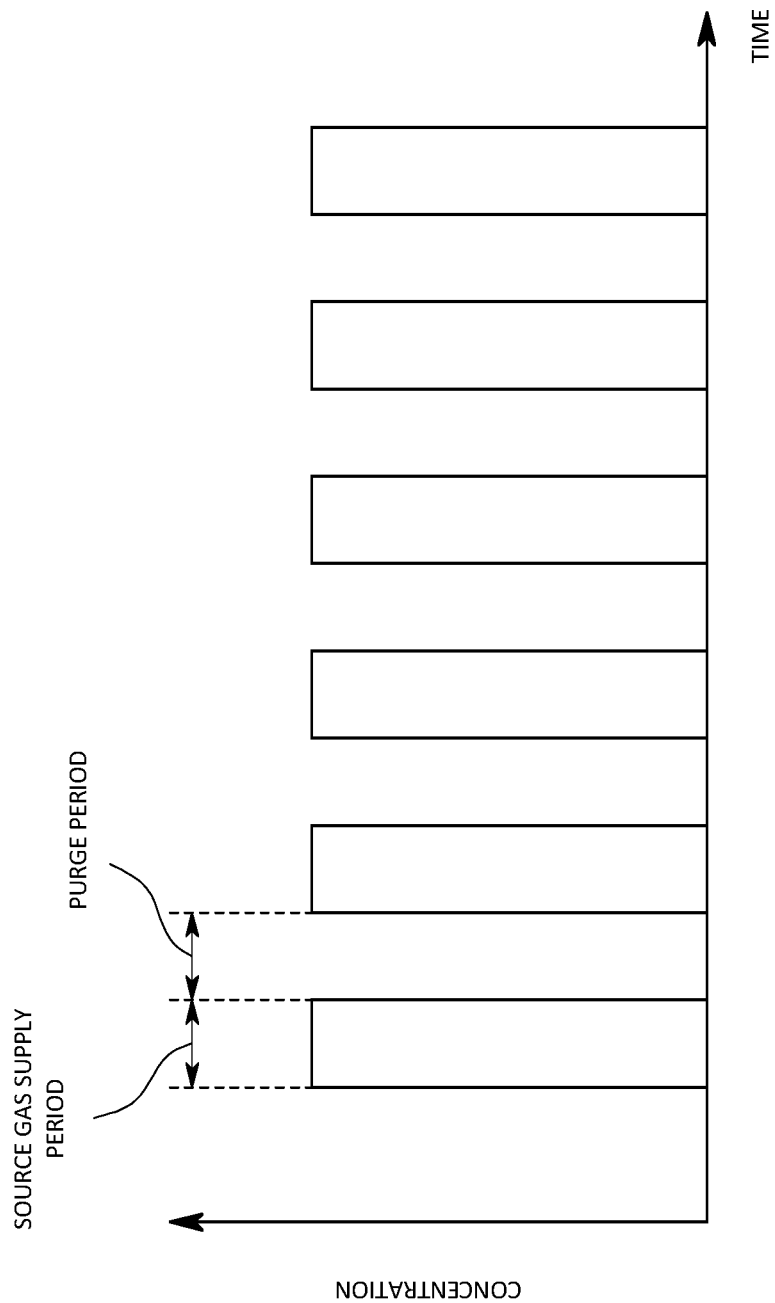
FIG. 3 is a schematic diagram illustrating an example of a change in the concentration of source gas in the first embodiment.

In the first embodiment, as illustrated in FIG. 3, the source gas supply period during which the concentration is kept at a predetermined value and the purge period during which in order to purge the inside of the chamber CN, only the carrier gas is supplied and the concentration of the source gas in the mixed gas is zero are alternately repeated. In addition, at least a measurement point of the partial pressure sensor 12 in the lead-out flow path ML, the purge period can be continued for a length of time sufficient to completely replace the source gas supplied during the source gas supply period with the carrier gas supplied during the purge period.

During the source gas supply period, the control mechanism COM opens the first on-off valve V1 and the second on-off valve V2 and closes the third on-off valve V3 to allow the carrier gas to perform bubbling via the inside of the tank TN on the basis of a gas supply period setting instruction that provides the source gas supply period and the purge period. On the other hand, during the purge period, the control mechanism COM closes the first on-off valve V1 and the second on-off valve V2, and opens the third on-off valve V3 to allow the carrier gas to be directly supplied to the lead-out flow path via the bypass flow path BL.

Next, the automatic zero adjustment of the concentration measurement mechanism 1 by the judgement time point determination part 3 and the zero adjustment part 4 will be described. In the first embodiment, during the above-described purge period of the ALD process, it is automatically detected that through the lead-out flow path, the source gas does not flow but only the carrier gas or the diluent gas flows, and the zero adjustment of the partial pressure sensor 12 is made.

That is, the judgement time point determination part 3 determines a judgement time point that is the time point when the replacement from the mixed gas to the carrier gas or the diluent gas is completed in a position where the concentration control mechanism 1 is provided. In addition, the judgement time point determination part 3 determines the judgement time point also when, for example, evacuating the chamber CN to perform purging after the end of the ALD process.

Figure 4:
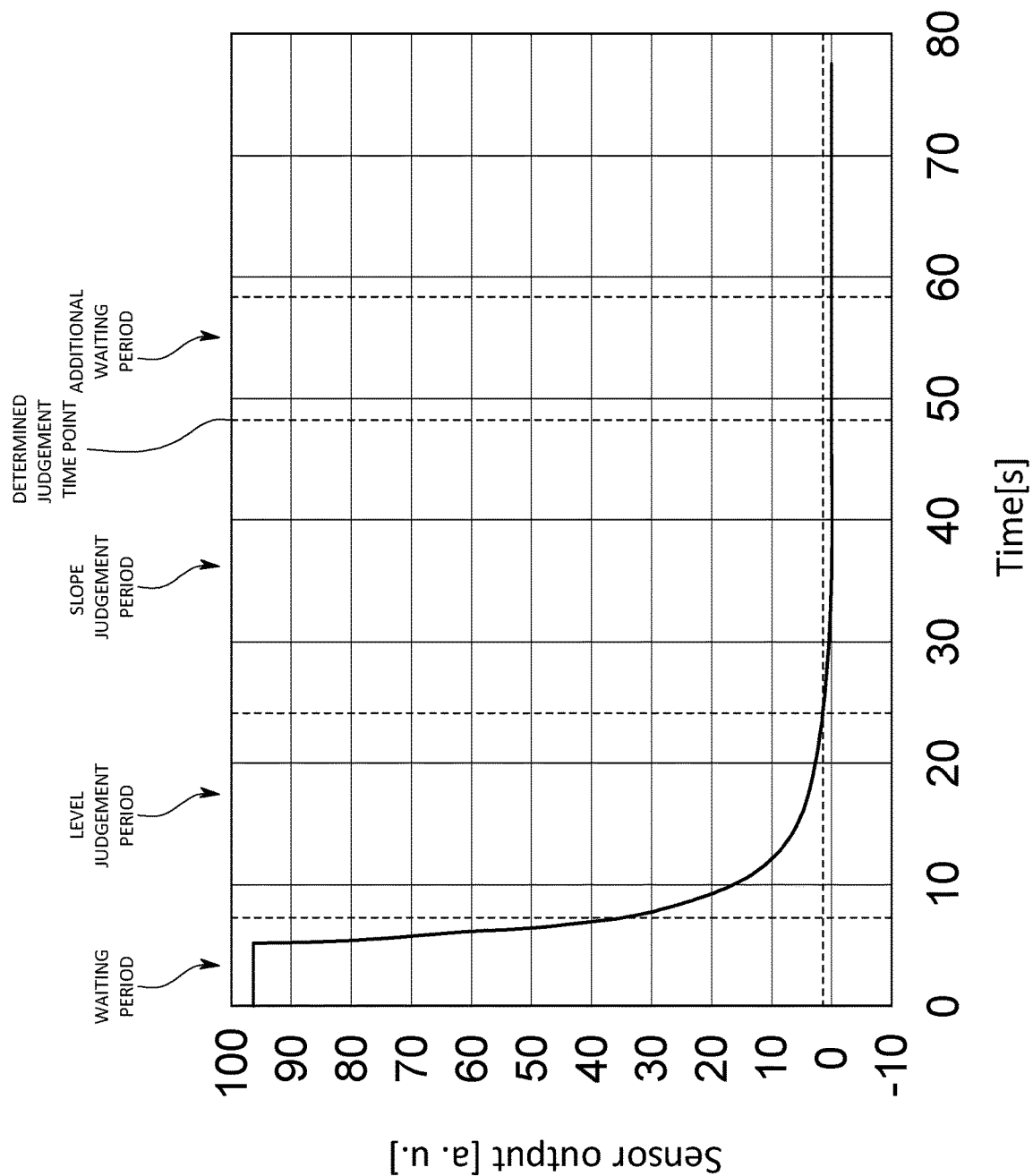
FIG. 4 is a schematic graph illustrating an application example of judgement time point determination algorithm in a judgement time point determination part in the first embodiment.

First, an operation for determining the judgement time point when the replacement with the carrier gas or the diluent gas is completed in the lead-out flow path ML will be described. In the first embodiment, the judgement time point determination part 3 determines, as the judgement time point, the time point when the measured concentration output of the concentration measurement mechanism 1 satisfies a predetermined condition. That is, with a time point to start the purge period as a trigger, the judgement time point determination part 3 starts the determination. As illustrated in a graph of FIG. 4, a predetermined time since the time point to start the purge period and activate the trigger is set as a determination waiting time when no determination is made.

Figure 5:
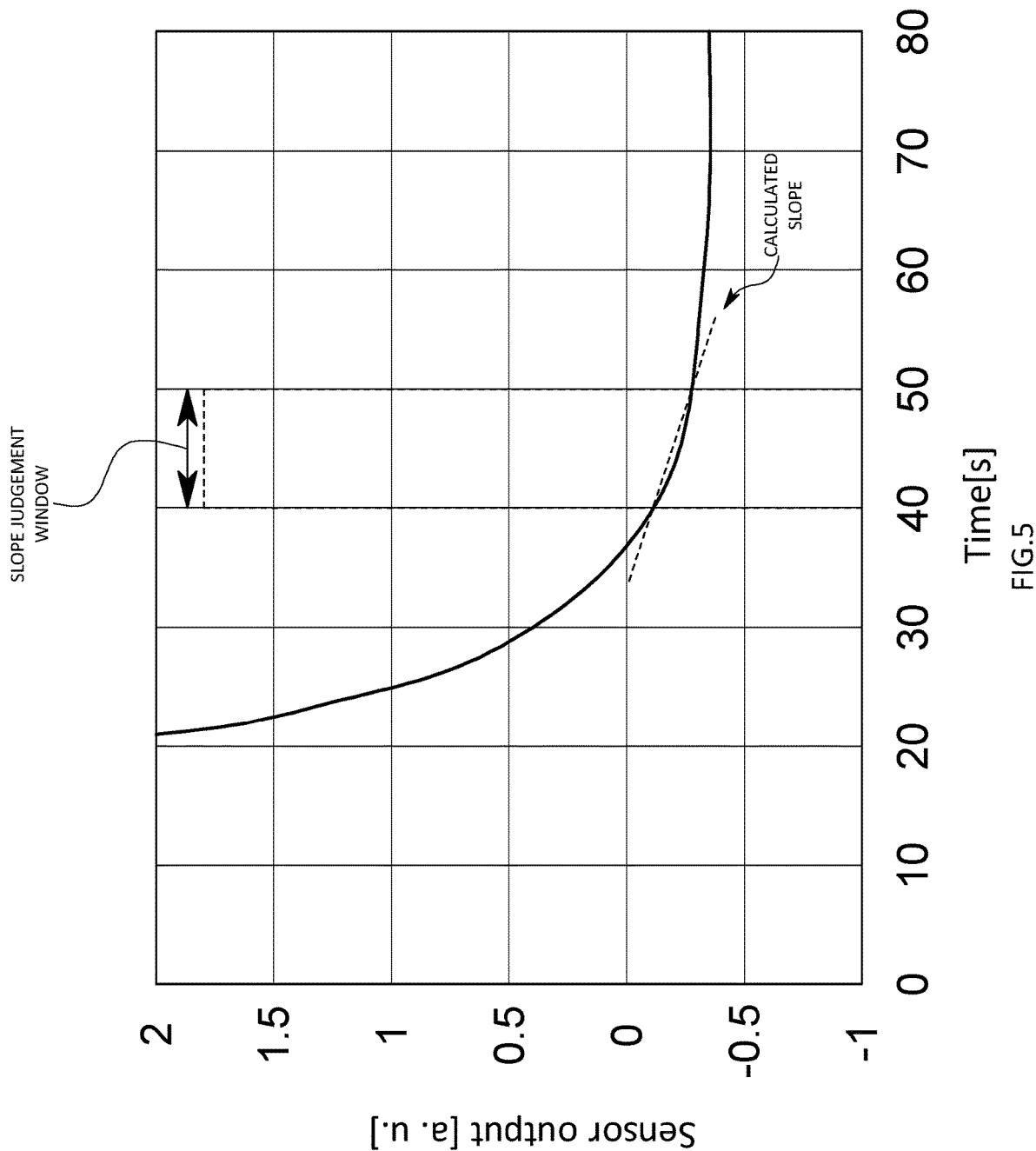
FIG. 5 is a schematic diagram illustrating the details of slope judgement in the first embodiment.

After the determination waiting time has elapsed, the judgement time point determination part 3 judges whether the output of the concentration measurement mechanism 1 becomes a threshold value or less. When or after the output of the concentration measurement mechanism 1 becomes the threshold value or less, the judgement time point determination part 3 makes a slope judgement that judges whether the absolute value of the time change amount of the output of the concentration measurement mechanism 1 becomes a predetermined value or less. As illustrated in FIG. 5, the slope judgement uses a least-square method to perform fitting to the linear expression $y=ax+b$ within a slope calculation window including a predetermined number of successive data points, and calculates the slope a. In addition, the slope a may be obtained not by the fitting but by using two points corresponding to the latest data and the oldest data within the slope calculation window. At the time point when the absolute value of the slope a becomes the predetermined value or less, the judgement time point determination part 3 determines the time point as the judgement time point. In this manner, the time point when the mixed gas containing the source gas has been replaced with the carrier gas or diluent gas not containing the source gas at least at the measurement point is determined. In addition, in this embodiment, the judgement time point determination part 3 makes the determination on the basis of the measured concentration measured by the concentration measurement mechanism 1. However, the judgement time point determination part 3 may be configured to determine the judgement time point on the basis of, instead of the measured concentration, the partial pressure measured by the partial pressure sensor 12 constituting the concentration measurement mechanism 1.

The zero adjustment part 4 instructs the concentration measurement mechanism 1 to make the zero adjustment at or after the judgement time point. In the first embodiment, at or after the judgement time point, waiting is performed again for an additional waiting time, and at the end of the additional waiting time, the zero adjustment part 4 instructs the concentration measurement mechanism 1 to make the zero adjustment. The concentration measurement mechanism 1 makes the zero adjustment on the basis of an internal state in accordance with the instruction of the zero adjustment part 4. In addition, the internal state used for the zero adjustment may be an internal state at a certain time point or the average value among a predetermined number of points.

Next, the determination of the judgement time point when the chamber CN is evacuated and the inside of the lead-out flow path ML also reaches a predetermined vacuum degree will be described. In this case, for example, the judgement time point determination part 3 receives an instruction signal, an input, or the like indicating the purging based on the evacuation of the chamber CN from a user, and with the time point of the reception as a trigger, determines the judgement time point. Alternatively, the judgement time point determination part 3 may monitor switching signals for the respective on-off valves to determine from valve states whether the lead-out flow path ML is evacuated. The judgement time point determination part 3 determines, on the basis of the output value of the total pressure sensor 11, the judgement time point that is the time point when the predetermined vacuum degree or less is reached. In addition, the determination whether the inside of the lead-out flow path ML reaches the predetermined vacuum degree is made in accordance with algorithm similar to that used to the above-described determination of the replacement with the carrier gas or the diluent gas.

Further, at the time point when the predetermined vacuum degree is achieved in the lead-out flow path ML, the zero adjustment part 4 instructs the concentration measurement mechanism 1 to make the zero adjustment.

In the concentration control system 200 of the first embodiment configured as described, the judgement time point determination part 3 can automatically determine the time point when in the lead-out flow path ML during the ALD process, only the carrier gas or the diluent gas is present, but the source gas is not present. In addition, it can determine the time point when the source gas is not present in the lead-out flow path ML and the output value of the partial pressure sensor 12 has to reach zero, and therefore the zero adjustment can be automatically made on the basis of the output value of the partial pressure sensor 12 at the time point.

Accordingly, it is possible to appropriately make the zero adjustment of the concentration measurement mechanism 1 while performing the ALD process. For this reason, even if the zero point of the concentration measurement mechanism 1 is shifted by temperature drift or the like, it is immediately corrected by the zero adjustment part 4, and therefore it becomes possible to make it difficult for an error to occur in the measured concentration value of the source gas in the mixed gas. In other words, without evacuating the lead-out flow path ML after stopping the respective gases from being supplied in order to make the zero adjustment of the concentration measurement mechanism 1, the zero adjustment of the concentration measurement mechanism 1 can be made.

In addition, the zero adjustment of the concentration measurement mechanism 1 can be automatically made also when the inside of the lead-out flow path ML reaches the predetermined vacuum degree by evacuation.

From these, the concentration control apparatus 100 of the first embodiment can eliminate the need to separately providing an additional sensor for determining the timing to start the zero adjustment of the concentration measurement mechanism 1 or to interrupt the process to perform a special operation for the zero adjustment. For this reason, the frequency of interrupting the process can be reduced to improve throughput more than before.

Next, variations of the first embodiment will be described.

The judgement time point determination part 3 in the first embodiment determines the judgement time point serving as a reference for the time point to make the zero adjustment on the basis of the output value of the concentration measurement mechanism 1, but may determine the judgement time point without using the output value.

That is, the judgement time point determination part 3 may be adapted to determine the judgement time point on the basis of both of a first time, which is the time when the gas in first volume that is the volume of the inside of a pipe to the cell in the lead-out flow path ML has been replaced, and a second time, which is the time when the gas in second volume that is the volume of the cell provided in the lead-out flow path ML has been replaced.

Specifically, the first time is the time when volume indicated by the accumulated flow rate of the carrier gas or the diluent gas measured by a corresponding flow rate sensor from the start of the purge period becomes equal to the first volume that is the volume of the pipe to the cell. In the case of the replacement with the carrier gas, the volume inside a pipe from the third on-off valve V3 in the bypass flow path BL to the cell corresponds to the first volume. Also, in the case of the replacement with the diluent gas, the volume inside a pipe from the merging point between the diluent flow path DL and the lead-out flow path ML to the cell corresponds to the first volume.

Figure 6:
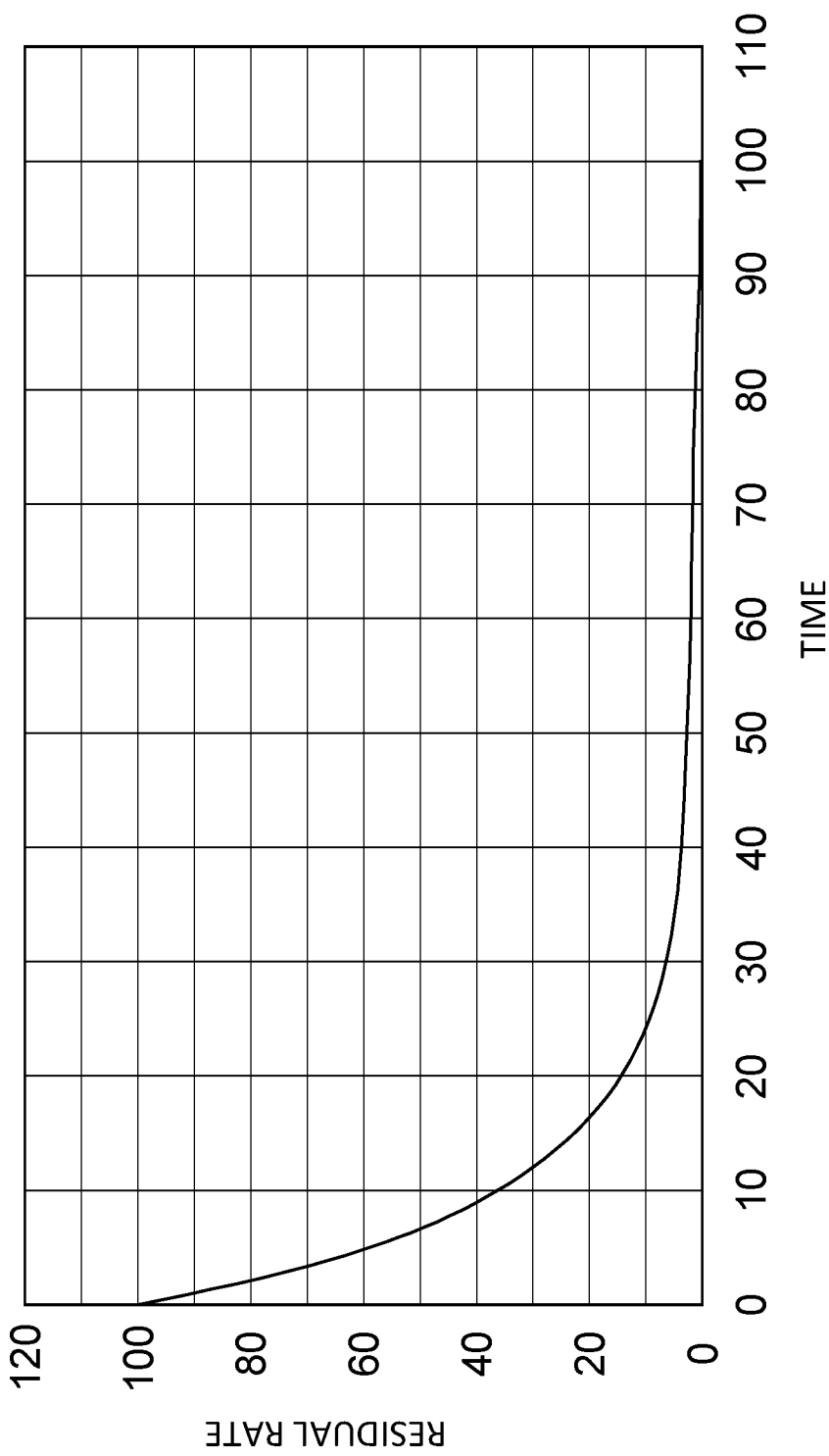
FIG. 6 is a schematic graph illustrating an application example of judgement time point determination algorithm based on a prediction expression in the judgement time point determination part in a variation of the first embodiment.

Also, the residual rate of the source gas in the cell exponentially decreases as illustrated in a graph of FIG. 6. Therefore, the judgement time point determination part 3 determines the second time from the elapsed time of the first time on the basis of a prediction expression $R_i = R_{i-1} (\text{Exp}(-Q/V * \Delta t))$. Here, the residual rate of the source gas at this time point, $R_{i-1}$: the residual rate of the source gas before a unit time $\Delta t$, Q: the flow rate of the carrier gas or the diluent gas flowing into corresponding volume, and V: the second volume that is the volume of the cell in which the mixed gas is to be replaced.

The judgement time point determination part 3 determines the time point when the calculated residual rate $R_i$ reaches a predetermined value or less (e.g., 0.1% or less) as the second time when the replacement with the carrier gas or the diluent gas is completed in the second volume that is the volume of the cell. Alternatively, the judgement time point determination part 3 may be adapted to calculate current predicted concentration by multiplying the residual rate $R_i$ by the initial value C0 of a concentration change, and as the second time, determine the time point when the predicted concentration sufficiently fall below the measurement limit of the concentration measurement mechanism 1. Specifically, the time point when the predicted concentration decreases to 1/10 or less of the detection limit of the concentration measurement mechanism 1 only has to be determined as the second time. The second time determined as described serves as the judgement time point to make the zero adjustment.

The judgement time point determination part 3 determines the reference time using the first time and the second time calculated as described.

In addition, other examples of volume in which the replacement is to be performed include the volume inside a pipe from a valve of each mass flow controller or on-off valves to a part where the concentration measurement mechanism 1 is provided. For example, when the second mass flow controller MFC2 is brought into a fully closed state to replace the mixed gas only with the carrier gas, the volume corresponds to the sum of volume from the second on-off valve V2, the third on-off valve V3, and the second mass flow controller MFC2 to the concentration measurement mechanism 1 and the volume of the concentration measurement mechanism 1 itself.

Also, when only the carrier gas is supplied and the flow rate Q is the flow rate of the carrier gas, it is only necessary to use a measured flow rate by the first mass flow controller MFC1. When both the carrier gas and the diluent gas are supplied, it is only necessary to use the sum of measured flow rates by the respective mass flow controllers. In addition, when the output value of each of the mass flow controllers corresponds to a mass flow rate, the value of a volume flow rate to which the mass flow rate is converted with use of the temperature and pressure of corresponding gas is used for the flow rate Q.

In addition, as a flow rate used to calculate the first time and the second time, instead of a measured flow rate by a mass flow controller, a set flow rate may be used. Further, in the present embodiment, the first time and the second time are calculated as actual time proceeds, but may be calculated in advance with use of a preliminarily known set flow rate.

Also, for the volume, the design values of the lead-out flow path ML and the cell are used, but a value obtained by another method may be used. For example, a concentration change at the time of gas replacement is separately measured at the time of factory shipment, and the value of the volume V obtained by back calculating the above prediction expression using the result of the measurement may be used. Alternatively, the volume V may be calculated from the above prediction expression on the basis of a concentration change when the replacement from the mixed gas to the carrier gas is performed during the ALD process. At this time, in order to prevent a reduction in the accuracy of the calculated volume V even if the zero point of the concentration measurement mechanism 1 is shifted, it is desirable to use the initial section of the concentration change.

Further, the volume V may be calculated on the basis of the flow rate (corresponding to an outflow molar number) of gas flowing out of target volume during a change from a first pressure to a second pressure after increasing the pressure inside the target volume and the gas state equation.

Figure 7:
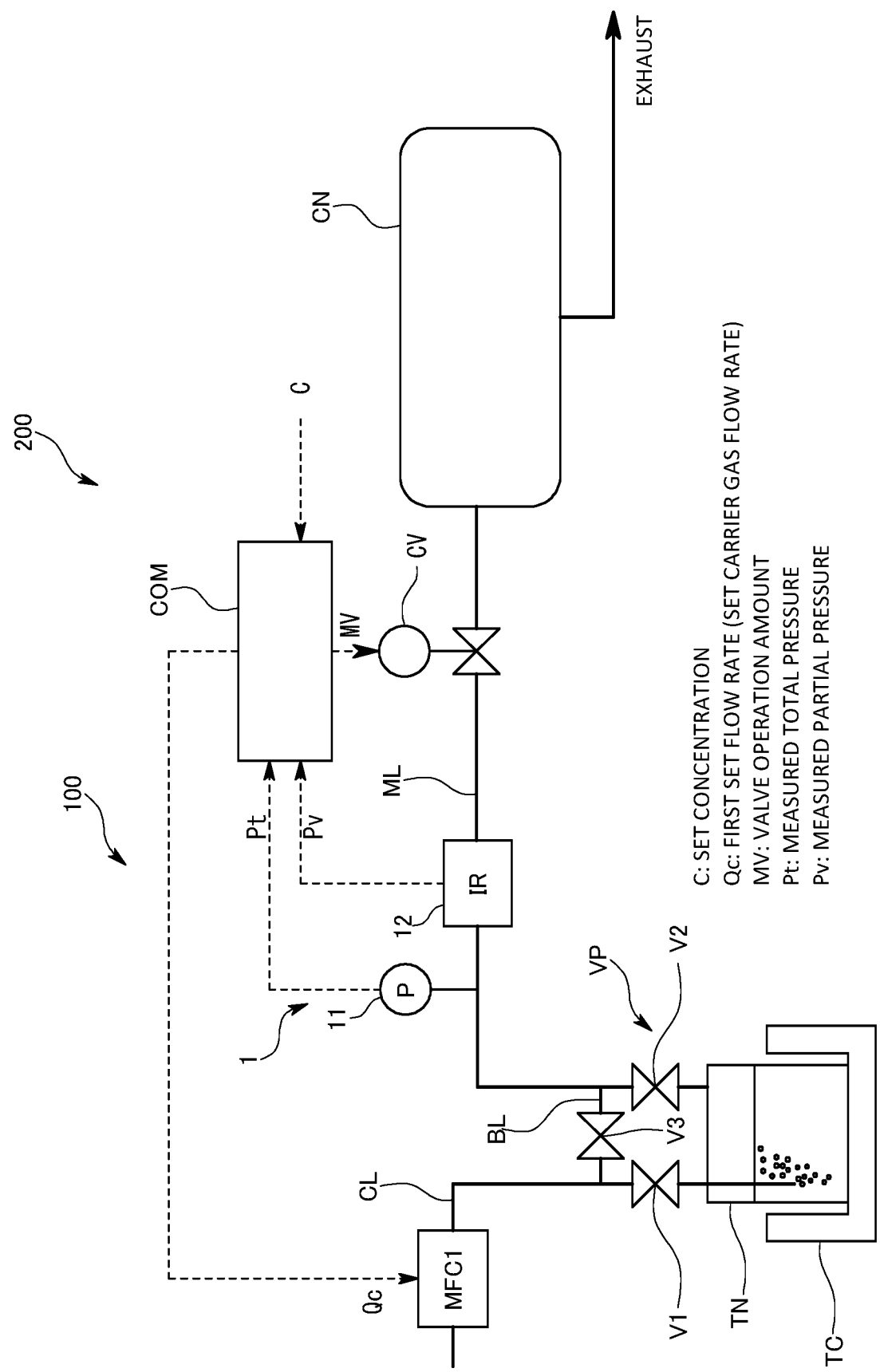
FIG. 7 is a schematic diagram illustrating a concentration control system and a concentration control apparatus according to a second embodiment of the present invention.
Figure 8:
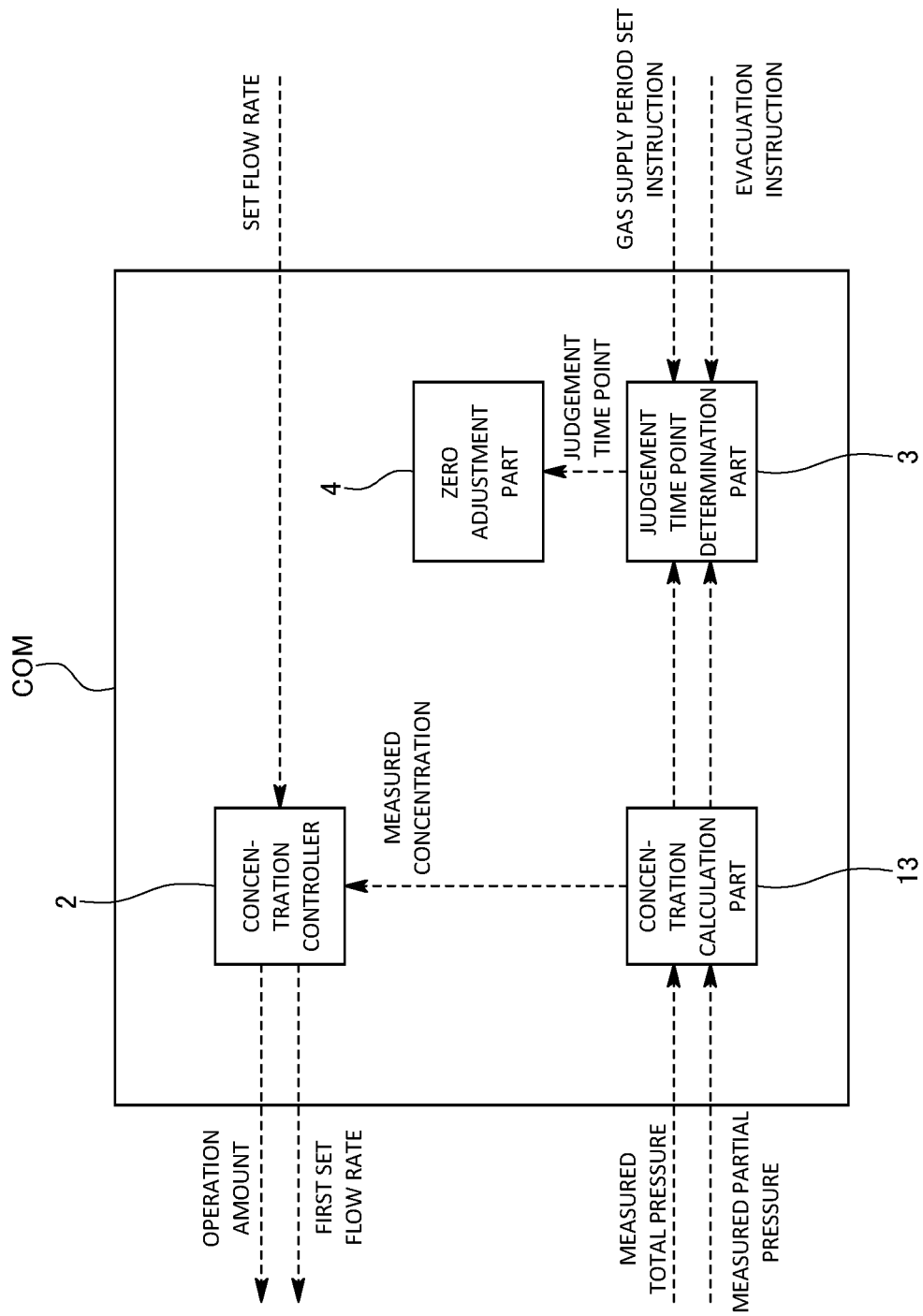
FIG. 8 is a functional block diagram illustrating the details of a control mechanism in the second embodiment.

Next, a concentration control system 200 and a concentration control apparatus 100 according to a second embodiment of the present invention will be described with reference to FIGS. 7 and 8. In addition, members corresponding to the respective members described in the first embodiment are marked with the same reference signs.

The concentration control system 200 in the second embodiment is one that performs concentration control that does not dilute mixed gas led out of a tank TN with diluent gas to bring concentration close to set concentration but, without using the diluent gas, control the total pressure of the mixed gas flowing through a lead-out flow path ML to bring the concentration of source gas contained in the mixed gas close to the set concentration.

That is, as compared with the first embodiment, the concentration control apparatus 100 of the second embodiment is different in that a control valve CV for controlling the total pressure of the mixed gas is provided in the lead-out flow path ML and in that the outputs of a concentration controller 2 are a first set flow rate for controlling the flow rate of carrier gas by a first mass flow controller MFC1 and the operation amount of the control valve CV.

More specifically, the concentration controller 2 in the second embodiment outputs, for example, a fixed value as the first set flow rate to perform control so that a constant flow rate of the carrier gas is constantly continuously supplied into the tank TN from the first mass flow controller MFC1.

On the other hand, with regard to the opening level of the control valve CV provided in the lead-out flow path ML, the concentration controller 2 performs concentration feedback control based on the deviation between set concentration and measured concentration measured by a concentration measurement mechanism 1. Specifically, when the measured concentration is smaller than the set concentration, the concentration controller 2 relatively increases the partial pressure of the source gas to raise the concentration of the source gas in the mixed gas by increasing the opening level of the control valve CV to reduce the total pressure of the mixed gas. On the other hand, when the measured concentration is larger than the set concentration, the concentration controller 2 relatively decreases the partial pressure of the source gas to reduce the concentration of the source gas in the mixed gas by decreasing the opening level of the control valve CV to raise the total pressure of the mixed gas. In each case, the magnitude of the operation amount of the control valve CV is set to a value corresponding to the deviation between the set concentration and the measured concentration.

In addition, when the source gas supply period and the purge period as illustrated in FIG. 3 are repeated in the second embodiment as well as in the first embodiment, a control mechanism COM controls the combination of on/off of respective on-off valves. That is, during the source gas supply period, the control mechanism COM opens a first on-off valve V1 and a second on-off valve V2 and closes a third on-off valve to allow the carrier gas to perform bubbling through the inside of the tank TN. On the other hand, during the purge period, the control mechanism COM closes the first on-off valve V1 and the second on-off valve V2, and opens the third on-off valve V3 to allow the carrier gas to be supplied directly to the lead-out flow path ML through a bypass flow path BL.

A judgement time point determination part 3 and a zero adjustment part 4 have the same configurations as those in the first embodiment, and for example, during the purge period, the judgement time point determination part 3 determines the time point when the mixed gas in the lead-outflow path ML has been replaced with the carrier gas, and the zero adjustment part 4 automatically makes a zero adjustment of the concentration measurement mechanism 1 on the basis of the result of the determination. Also, in the case where a chamber CN is evacuated as well, the judgement time point determination part 3 determines whether the inside of the lead-out flow path ML reaches a predetermined vacuum degree, and the zero adjustment part 4 makes the zero adjustment of the concentration measurement mechanism 1 on the basis of the result of the determination.

Even the concentration control system 200 of a pressure type as in the second embodiment can automatically perform the zero adjustment of the concentration measurement mechanism 1 without stopping a process because of the operations of the judgement time point determination part 3 and zero adjustment part 4 or performing a special operation for adjustment work.

Figure 9:
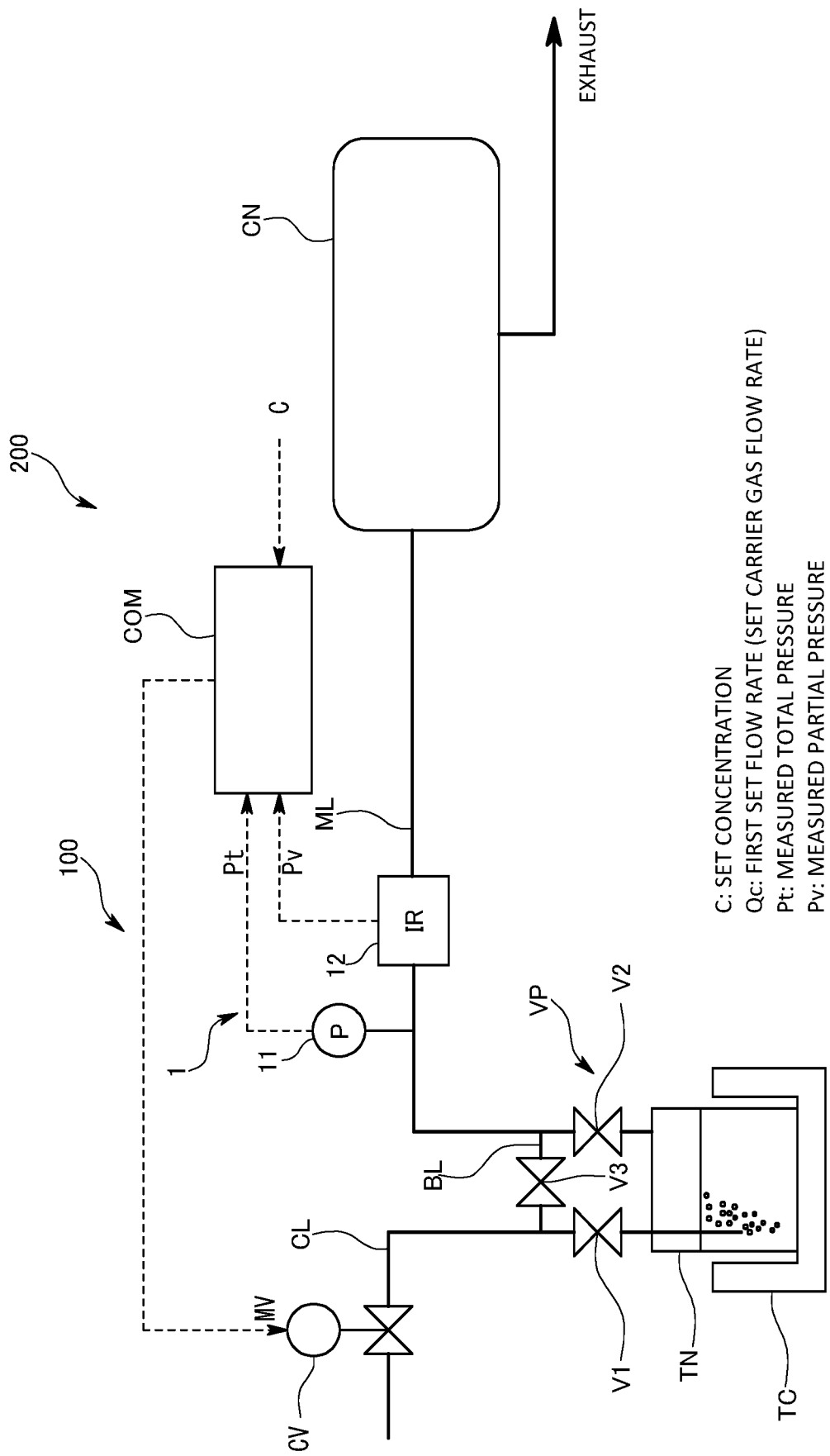
FIG. 9 is a schematic diagram illustrating a concentration control system and a concentration control apparatus according to a third embodiment of the present invention.
Figure 10:
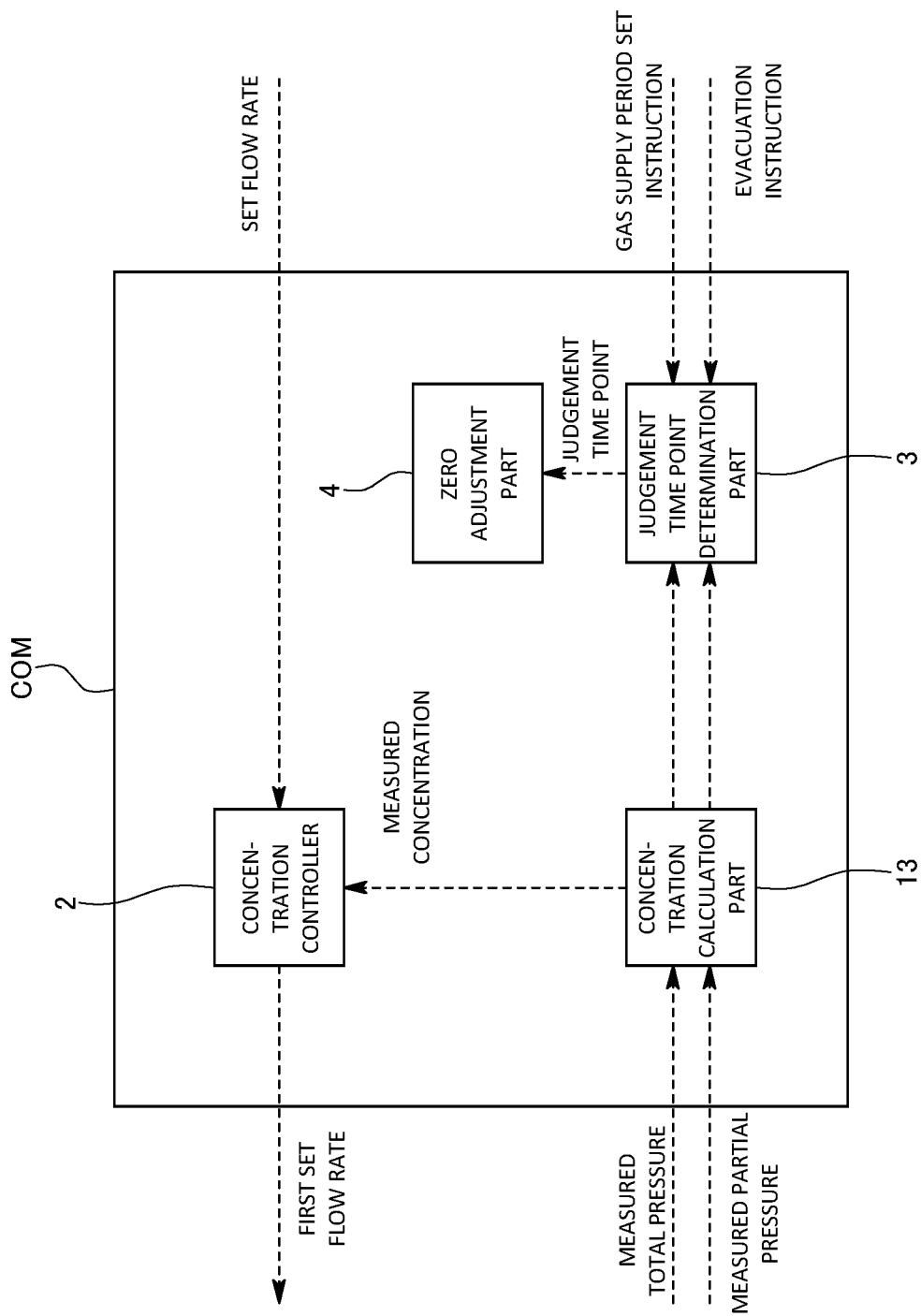
FIG. 10 is a functional block diagram illustrating the details of a control mechanism in the third embodiment.

Next, a concentration control system 200 and a concentration control apparatus 100 in a third embodiment will be described with reference to FIGS. 9 and 10. In addition, members corresponding to the respective members described in the first embodiment are marked with the same reference signs.

In the concentration control system 200 in the third embodiment, only a control valve CV is provided in an introduction flow path CL, and concentration feedback control of the flow rate of carrier gas is performed using the control valve CV to thereby perform control so that the concentration of source gas in mixed gas flowing through a lead-out flow path ML is kept at set concentration.

That is, as compared with the first embodiment, the concentration control apparatus 100 of the third embodiment is different in that the control valve CV is provided in the introduction flow path CL and in that a concentration controller 2 controls the control valve CV in the introduction flow path CL on the basis of the deviation between the set concentration and measured concentration measured by a concentration measurement mechanism 1.

Even in the third embodiment configured as described, the configurations and operations of a judgement time point determination part 3 and a zero adjustment part 4 are the same as those in the first embodiment and the second embodiment.

That is, during a purge period, a control mechanism COM flows the carrier gas through a bypass flow path BL, and at the time point when the mixed gas has been replaced with the carrier gas, a zero adjustment of a partial pressure sensor 12 is automatically made. Also, in the case where a chamber CN is evacuated as well, zero adjustments of a total pressure sensor 11 and the partial pressure sensor 12 are automatically made at the time point when the inside of the lead-out flow path ML reaches a predetermined vacuum degree.

Other embodiments will be described.

The concentration control apparatus according to the present invention is not only used for the ALD process, but can be used to control the concentration of source gas in mixed gas in other semiconductor manufacturing processes or even in a process other than the semiconductor manufacturing processes. That is, the intended use of the present invention is not limited to one described in the embodiments.

The concentration control apparatus may be one in which the respective fluid equipment and control equipment are modularized. Also, the concentration control apparatus may be configured not to include the respective on-off valves but to perform only on-off control of an on-off valve provided to the vaporizer.

The material contained in the tank is not limited to the liquid but may be a solid.

In order to determine the judgement time point, without using the output of the concentration measurement mechanism, with a pressure sensor for low pressure separately provided in the lead-out flow path, the judgement time point determination part may be adapted to, on the basis of the output of the pressure sensor for low pressure, determine whether the predetermined vacuum degree is achieved. In addition, as the pressure sensor for low pressure, for example, it is only necessary to use one having a resolution of about 1/10 of the detection limit of the total pressure sensor or the partial pressure sensor.

The determination of the judgement time point by the judgement time point determination part may be made not by making both the level judgement and the slope judgement but by only any one of them. Also, the zero adjustment part may be adapted to make the zero adjustment not on the basis of the output value of the sensor after the additional waiting time has elapsed but at the judgement time point.

In the first embodiment, the diluent gas flow path is provided separately from the introduction flow path; however, for example, the diluent gas flow path may be adapted to branch from the upstream side of the first mass flow controller in the introduction flow path and merge with the lead-out flow path. The carrier gas and the diluent gas may be adapted to be ones having the same component in this manner or having different components. In addition, it is only necessary that the carrier gas and the diluent gas have components not having a light absorption wavelength band used by the partial pressure sensor.

As the concentration measurement mechanism, in each of the embodiments, one including the total pressure sensor and the partial pressure sensor is exemplified; however, for example, an ultrasonic sensor may be used to measure the concentration of the source gas in the mixed gas. That is, the concentration measurement mechanism may be configured to measure the concentration using the fact that a change in the concentration of the source gas in the mixed gas changes sound velocity. Even in the case of such a concentration measurement mechanism, the judgement time point determination part can determine the judgement time point when the gas replacement is completed or the predetermined vacuum degree is achieved, and the zero adjustment part can automatically make the zero adjustment.

The concentration control by the concentration control system is not limited to those described in the respective embodiments, but may be adapted to keep the concentration of the source gas in the mixed gas at the set concentration by combining parts or all of respective methods.

Besides, various combinations and modifications of the embodiments may be made without departing from the scope of the present invention.

REFERENCE SIGNS LIST

200: Concentration control system
100: Concentration control apparatus
CV: Control valve
1: Concentration measurement mechanism
11: Total pressure sensor
12: Partial pressure sensor
13: Concentration calculation part
2: Concentration controller
3: Judgement time point determination part
4: Zero adjustment part

The invention claimed is:

1. A concentration control apparatus provided to a vaporizer having a tank that contains material, a lead-out flow path for leading source gas out of the tank, the source gas resulting from vaporization of the material, and a gas supply flow path for supplying another gas different from the source gas to the lead-out flow path, the concentration control apparatus comprising:
a control valve that controls gas flowing through the lead-out flow path;
a concentration measurement mechanism that is provided in the lead-out flow path to measure concentration of the source gas contained in gas flowing through the lead-out flow path; and
a computer configured to
control the control valve so that a deviation between a measured concentration measured by the concentration measurement mechanism and a preset set concentration decreases;
determine a judgement time point comprising a time point at which the gas present in a measurement part at which the concentration measurement mechanism performs the concentration measurement has been replaced with the other gas; and
make a zero adjustment of the concentration measurement mechanism to adjust the value of the concentration measurement of the source gas in gas flowing through the lead-out flow path to be zero on a basis of an internal state in the concentration measurement mechanism at or after the judgement time point.

2. The concentration control apparatus according to claim 1,
wherein the other gas is a carrier gas, and wherein
the vaporizer further comprises an introduction flow path for introducing the carrier gas into the tank,
the gas supply flow path is a bypass flow path that bypasses the tank and connects the introduction flow path and the lead-out flow path, and
the computer is configured to determine, as the judgement time point, a time point at which the gas present in the measurement part has been replaced with the carrier gas supplied through the bypass flow path.

3. The concentration control apparatus according to claim 1,
wherein the other gas is a diluent gas, and wherein
the gas supply flow path is a diluent gas flow path for introducing the diluent gas into the introduction flow path, and
the computer is configured to determine, as the judgement time point, a time point at which the gas present in the measurement part has been replaced with the diluent gas.

4. The concentration control apparatus according to claim 1, wherein the computer is configured to determine the judgement time point on a basis of a volume from a supply point from which the other gas is supplied from the gas supply flow path to the lead-out flow path to the concentration measurement mechanism and a flow rate of the other gas supplied from the gas supply flow path.

5. The concentration control apparatus according to claim 4, wherein
the volume comprises
a first volume inside a pipe forming the lead-out flow path, and
a second volume of a cell into which the gas flows from inside the pipe and the concentration is measured by the concentration measurement mechanism, and
the computer is configured to determine the judgement time point with use of a first time that is a time when the gas in the first volume has been replaced with the other gas and a second time that is a time when the gas in the second volume has been replaced with the other gas.

6. The concentration control apparatus according to claim 5, wherein the computer is configured to calculate, as the first time, a time until a volume indicated by an accumulated flow rate of the other gas becomes equal to the first volume.

7. The concentration control apparatus according to claim 5,
wherein the computer is configured to, on a basis of a prediction expression for a residual rate of the source gas, calculate as the second time a time when the gas in the cell has been replaced with the other gas,
wherein the prediction expression comprises $R_i = R_{i-1}(\text{Exp}(-Q/V*\Delta t))$
where $R_i$ is the residual rate of the source gas at the second time, $R_{i-1}$ is the residual rate of the source gas before a unit time $\Delta t$, Q is a flow rate of the other gas, and V is the second volume of the cell in which the replacement with the other gas is to be performed.

8. The concentration control apparatus according to claim 1, wherein
the concentration measurement mechanism comprises:
a total pressure sensor that measures a total pressure of the gas present in the measurement part;
a partial pressure sensor that measures a partial pressure of the source gas in the gas present in the measurement part; and
a concentration calculation part that, on a basis of the total pressure measured by the total pressure sensor and the partial pressure measured by the partial pressure sensor, is configured to calculate the concentration of the source gas in the gas present in the measurement part, and
the computer is configured to determine the judgement time point on a basis of the partial pressure measured by the partial pressure sensor.

9. A concentration control apparatus provided to a vaporizer having a tank that contains material, a lead-out flow path for leading source gas out of the tank, the source gas resulting from vaporization of the material, and a gas supply flow path for introducing another gas different from the source gas to the lead-out flow path, the concentration control apparatus comprising:
a control valve that controls gas flowing through the lead-out flow path;
a concentration measurement mechanism that is provided in the lead-out flow path to measure concentration of the source gas contained in gas flowing through the lead-out flow path; and
a computer configured to
control the control valve so that a deviation between a measured concentration measured by the concentration measurement mechanism and a preset set concentration decreases;
determine a judgement time point comprising a time point at which a predetermined degree of vacuum is achieved in a measurement part at which the concentration measurement mechanism performs the concentration measurement; and
make a zero adjustment of the concentration measurement mechanism to adjust the value of the concentration measurement of the source gas in gas flowing through the lead-out flow path to be zero on a basis of an internal state in the concentration measurement mechanism at or after the judgement time point.

10. The concentration control apparatus according to claim 9, wherein the concentration measurement mechanism comprises:
a total pressure sensor that measures a total pressure of the gas present in the measurement part; and
a partial pressure sensor that measures a partial pressure of the source gas in the gas present in the measurement part, wherein
the computer, on a basis of the total pressure measured by the total pressure sensor and the partial pressure measured by the partial pressure sensor, is configured to calculate the concentration of the source gas in the gas present in the measurement part, and
the computer is configured to determine the judgement time point on a basis of the total pressure measured by the total pressure sensor.

11. The concentration control apparatus according to claim 9, further comprising
a pressure sensor configured to sense a low pressure, the pressure sensor being provided in the lead-out flow path, wherein the computer is configured to determine, as the judgement time point, a time point at which a pressure measured by the pressure sensor for sensing low pressure becomes a predetermined value or less.

12. A zero adjustment method for a concentration control apparatus according to claim 1, the zero adjustment method comprising:
   determining a judgement time point that is a time point at which the gas present in a measurement part at which the concentration measurement mechanism performs the concentration measurement has been replaced with the other gas; and
   making a zero adjustment of the concentration measurement mechanism to adjust the value of the concentration measurement of the source gas in gas flowing through the lead-out flow path to be zero on a basis of an internal state in the concentration measurement mechanism at or after the judgement time point.

13. A program recording medium recorded with a concentration control apparatus program used for a concentration control apparatus according to claim 1, the concentration control apparatus program instructing a computer to fulfill functions comprising:
   controlling the control valve so that a deviation between a measured concentration measured by the concentration measurement mechanism and a preset set concentration decreases;
   determining a judgement time point comprising a time point at which the gas present in a measurement part at which the concentration measurement mechanism performs the concentration measurement has been replaced with the other gas; and
   making a zero adjustment of the concentration measurement mechanism to adjust the value of the concentration measurement of the source gas in gas flowing through the lead-out flow path to be zero on a basis of an internal state in the concentration measurement mechanism at or after the judgement time point.

* * * * *